United States Patent
Wakamori

(10) Patent No.: US 8,564,350 B2
(45) Date of Patent: Oct. 22, 2013

(54) HYSTERESIS DEVICE

(75) Inventor: Yasuo Wakamori, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 13/276,071

(22) Filed: Oct. 18, 2011

(65) Prior Publication Data

US 2012/0092056 A1 Apr. 19, 2012

(30) Foreign Application Priority Data

Oct. 19, 2010 (JP) ................................. 2010-234553

(51) Int. Cl.
*H03K 3/00* (2006.01)
(52) U.S. Cl.
USPC .............................. 327/205; 327/64; 327/307
(58) Field of Classification Search
USPC ........... 327/205, 206, 307, 63, 64, 67, 77, 87, 327/89

See application file for complete search history.

(56) References Cited

U.S. PATENT DOCUMENTS 7,098,716 B2 * 8/2006 Ono ............................... 327/307
2012/0044006 A1 * 2/2012 Kao et al. ....................... 327/307

FOREIGN PATENT DOCUMENTS

WO WO 2008/099662 A1 8/2008

* cited by examiner

*Primary Examiner* — Long Nguyen
(74) *Attorney, Agent, or Firm* — Crowell & Moring LLP

(57) ABSTRACT

A hysteresis device produces an output signal in accordance with hysteresis characteristics that changes at a plurality of thresholds with respect to an input signal. The hysteresis apparatus includes an input signal adjusting section that outputs an adjustment signal in which an offset level corresponding to each of the plurality of thresholds is added to the input signal, a comparator that outputs a first signal based on the adjustment signal, the first signal being binarized, and a determining section that controls the input signal adjusting section to switch the offset level for each of the plurality of thresholds, that acquires the first signal for each switching of the offset level, and that produces a present output signal based on a previous output signal and the first signal corresponding to the threshold relating to a range to which the input signal is belonged.

4 Claims, 6 Drawing Sheets

FIG. 1
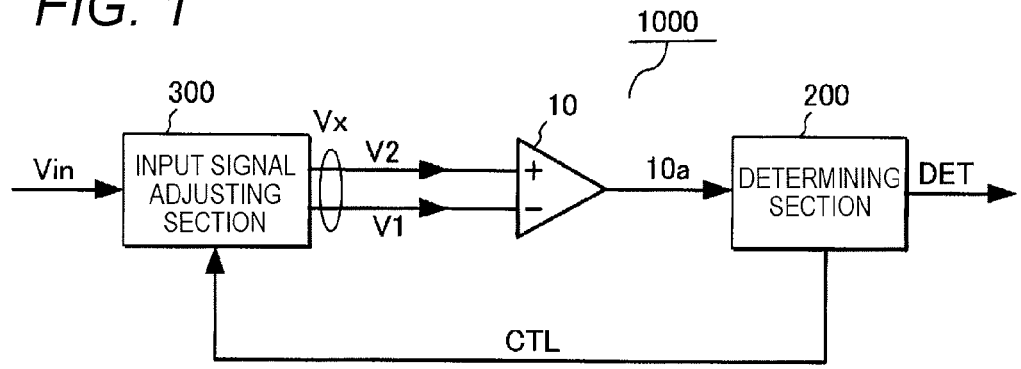
FIG. 2
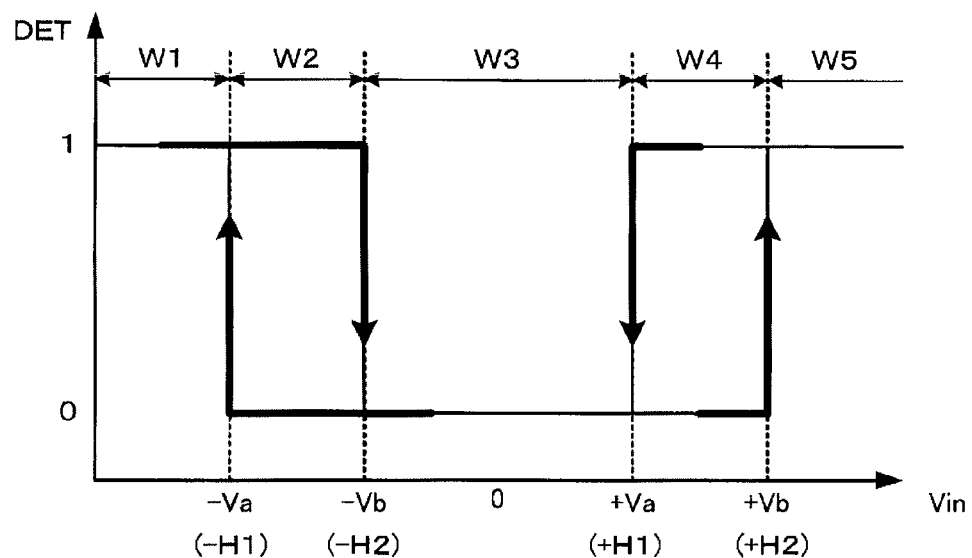
FIG. 3
|  |  | W1 | W2 | W3 | W4 | W5 |
|---|---|---|---|---|---|---|
| 10a | Vin<-Va | 1 | 0 | 0 | 0 | 0 |
|  | Vin<-Vb | 1 | 1 | 0 | 0 | 0 |
|  | Vin<+Va | 1 | 1 | 1 | 0 | 0 |
|  | Vin<+Vb | 1 | 1 | 1 | 1 | 0 |
| DET' |  | 0 | 1 | 0 | 1 | 0 | 1 | 0 | 1 | 0 | 1 |
| DET |  | 1 | 1 | 0 | 1 | 0 | 0 | 0 | 1 | 1 | 1 |

|  |  | W1 | W2 | W3 | W4 | W5 |
|---|---|---|---|---|---|---|
| 10a | Vin<−Va | 1 | 0 | − | − | − |
|  | Vin<−Vb | − | 1 | 0 | − | − |
|  | Vin<+Va | − | − | 1 | 0 | − |
|  | Vin<+Vb | − | − | − | 1 | 0 |
| DET' |  | − | − | 0 | 1 | − | − | 0 | 1 | − | − |
| DET |  | 1 | 1 | 0 | 1 | 0 | 0 | 0 | 1 | 1 | 1 |

HYSTERESIS DEVICE

BACKGROUND

The present invention relates to a hysteresis device.

In a comparator which compares an input signal with a threshold to output a binarized output signal, when the level of the input signal is varied in the vicinity of the threshold, chattering in which the level of the output signal is varied in a short time is caused. As means for preventing such chattering from occurring, a hysteresis circuit is known. For example, a hysteresis circuit uses two thresholds. The first threshold is indicated by Vref1, the second threshold is indicated by Vref2, and it is assumed that Vref1<Vref2. When the output signal transits from a low level to a high level, the second threshold Vref2 is used, and, when the output signal transits from a high level to a low level, the first threshold Vref1 is used.

Patent Reference 1 discloses a magnetic sensing device in which, from the viewpoint of prevention of chattering, an output signal of a bridge circuit is supplied to a Schmitt trigger circuit which is a kind of hysteresis circuit. Usually, a Schmitt trigger circuit is often configured by an amplifier which is positively fed back by using an operational amplifier, and a Zener diode is often added to an output stage in consideration of stability.

[Patent Reference 1] WO2008/099662

In the case where the above-described bridge circuit detects the existence or non-existence of magnetism, however, it is necessary to provide a Schmitt trigger circuit corresponding to +H of the polarity of the external magnetic field, and another Schmitt trigger circuit corresponding to −H of the polarity of the external magnetic field. Therefore, the circuit has a complicated configuration.

In the case where the Schmitt trigger circuits are operated at a low voltage, the threshold voltages which are adjusted in the Schmitt trigger circuits are very low, and hence there is a problem in that high accuracy is required.

SUMMARY

The invention is conducted in view of these circumstances. It is an object of the invention to provide a hysteresis device in which hysteresis characteristics can be applied to an output signal by a simple configuration.

In order to achieve the above object, according to the present invention, there is provided a hysteresis device which produces an output signal in accordance with hysteresis characteristics that changes at a plurality of thresholds with respect to an input signal, the hysteresis apparatus comprising:

an input signal adjusting section that outputs an adjustment signal in which an offset level corresponding to each of the plurality of thresholds is added to the input signal;

a comparator that outputs a first signal based on the adjustment signal, the first signal being binarized; and a determining section that controls the input signal adjusting section to switch the offset level for each of the plurality of thresholds, that acquires the first signal for each switching of the offset level, and that produces a present output signal based on a previous output signal and the first signals corresponding to the plurality of threshold.

Preferably, the input signal adjusting section produces differential signals as the adjustment signal; and the comparator compares the differential signals to produce the first signal.

Preferably, the determining section outputs a control signal which designates the offset level corresponding to one of the plurality of thresholds; and the input signal adjusting section includes: first and second output terminals which output the differential signals; four sensor elements; and an adjusting portion which switches the offset levels corresponding to the plurality of thresholds based on the control signal.

According to the present invention, there is also provided a hysteresis device which produces an output signal in accordance with hysteresis characteristics that change at a plurality of thresholds with respect to an input signal, the hysteresis apparatus comprising:

a threshold selecting section that selectively outputs the plurality of thresholds;

a comparator that compares the input signal with the threshold which is selected by the threshold selecting section, and that outputs a first signal being binarized; and a determining section that controls the threshold selecting section to switch the plurality of thresholds, that acquires the first signal for each switching of the plurality of thresholds, and that produces a present output signal based on a previous output signal and the first signals corresponding to the plurality of thresholds.

Preferably, when divided by the plurality of thresholds, the input signal is divided into a plurality of ranges, the output signal is binarized into a first logical value and a second logical value, among the plurality of ranges, a range where the output signal has the first logical value is set as a first logical value range, a range where the output signal has the second logical value is set as a second logical value range, and a range where the output signal has the first logical value or the second logical value is set as a common range, and the determining section determines, base on the first signals corresponding to the plurality of thresholds, that the input signal is belonged to which one of the first logical value range, the second logical value range, and the common range as follows: if the input signal belongs to the first logical value range, a present output signal is set as the first logical value; if the input signal belongs to the second logical value range, the present output signal is set as the second logical value; and if the input signal belongs to the common range, the present output signal is set to be coincident with a previous output signal.

BRIEF DESCRIPTION OF THE DRAWINGS

The above objects and advantages of the present invention will become more apparent by describing in detail preferred exemplary embodiments thereof with reference to the accompanying drawings, wherein:

FIG. 1 is a block diagram showing the configuration of a hysteresis device according to a first embodiment;

FIG. 2 is a graph showing hysteresis characteristics;

FIG. 3 is a truth table for producing an output signal in a determining section;

DETAILED DESCRIPTION OF EXEMPLARY EMBODIMENTS

Figures 4, 5:
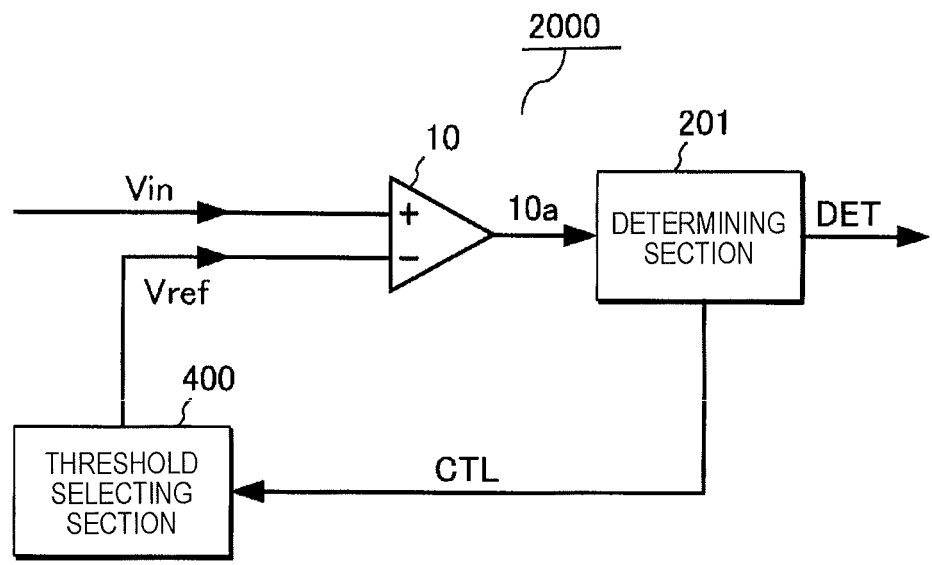
FIG. 4 is a block diagram showing the configuration of a hysteresis device according to a second embodiment.
FIG. 5 is a truth table for producing an output signal in a determining section according to a third embodiment.

Embodiments of the invention will be described with reference to the drawings.

1. Hysteresis Device

1-1: First Embodiment

FIG. 1 is a block diagram of a hysteresis device according to the first embodiment of the invention. The hysteresis device 1000 produces an output signal DET with respect to an input signal Vin in accordance with hysteresis characteristics shown in FIG. 2. In the hysteresis characteristics, the output signal DET is changed based on the input signal Vin with respect to a first threshold −Va, a second threshold −Vb, a third threshold +Va, and a fourth threshold +Vb.

In a state where the output signal DET is "0", when the input signal Vin is gradually reduced to be smaller than the first threshold −Va, the output signal DET is changed to a state of "1". By contrast, in the state where the output signal DET is "1", when the input signal Vin is gradually increased to be larger than the second threshold −Vb, the output signal DET is changed to the state of "0".

In the state where the output signal DET is "1", when the input signal Vin is gradually reduced to be smaller than the third threshold +Va, the output signal DET is changed to the state of "0". By contrast, in the state where the output signal DET is "0", when the input signal Vin is gradually increased to be larger than the fourth threshold +Vb, the output signal DET is changed to the state of "1".

The hysteresis device 1000 includes an input signal adjusting section 300, a comparator 10, and a determining section 200. A control signal CTL which designates an offset voltage corresponding to one of the first to fourth thresholds is supplied from the determining section 200 to the input signal adjusting section 300. In the input signal adjusting section 300, the offset voltage designated by the control signal CTL is added to the input signal Vin to produce an adjustment signal Vx. That means, the input signal adjusting section 300 adjusts the offset voltage in accordance with the control signal CTL and produces the adjustment signal Vx based on the input signal Vin and the offset voltage. In this embodiment, the adjustment signal Vx is provided in a differential form such as a first output voltage V1 and a second output voltage V2.

It is assumed that offset voltages corresponding to the first to fourth thresholds are Voff1 to Voff4, respectively. The offset voltage Voff1 is set so that, when Vin=−Va, $\Delta V=V2-V1=0$ is attained, and the polarities of the first output voltage V1 and the second output voltage V2 are set so that, when Vin<−Va, $\Delta V>0$ is attained. The offset voltage Voff1 is set so that, when Vin=−Vb, $\Delta V=V2-V1=0$ is attained, and the polarities of the first output voltage V1 and the second output voltage V2 are set so that, when Vin<−Vb, $\Delta V>0$ is attained.

The offset voltage Voff3 is set so that, when Vin=+Va, $\Delta V=V2-V1=0$ is attained, and the offset voltage Voff4 is set so that, when Vin=+Va, $\Delta V=V2-V1=0$ is attained. The polarities of the first output voltage V1 and the second output voltage V2 are set so that, when Vin>+Va, $\Delta V>0$ is attained. The offset voltage Voff4 is set so that, when Vin=+Vb, $\Delta V=V2-V1=0$ is attained, and the polarities of the first output voltage V1 and the second output voltage V2 are set so that, when Vin>+Vb, $\Delta V>0$ is attained.

The comparator 10 binarizes the adjustment signal Vx (V1, V2), and outputs a first signal 10a. In this embodiment, when V2>V1, the first signal 10a is "1", and, when V2<V1, the first signal 10a is "0".

The determining section 200 has a memory, and stores the previous output signal DET in the memory. The determining section 200 controls the input signal adjusting section 300 by using the control signal CTL so as to switch the offset voltages Voff1 to Voff4 corresponding to the first to fourth thresholds, obtains the first signal 10a for each switching of the offset voltages Voff1 to Voff4, and produces the present output signal DET based on the first signal 10a corresponding to the first to fourth thresholds and the previous output signal DET.

A range where the input signal Vin is smaller than the first threshold −Va is indicated as a first range W1, that where the input signal Vin is not smaller than the first threshold −Va and smaller than the second threshold −Vb is indicated as a second range W2, that where the input signal Vin is not smaller than the second threshold −Vb and smaller than the third threshold +Va is indicated as a third range W3, that where the input signal Vin is not smaller than the third threshold +Va and smaller than the fourth threshold +Vb is indicated as a fourth range W4, and that where the input signal Vin is not smaller than the fourth threshold +Vb is indicated as a fifth range W5. The determining section 200 determines to which one of the ranges the present input signal Vin belongs, and produces the present output signal DET to which hysteresis characteristics are provided, based on the determination result and the previous output signal DET.

In the case where the previous output signal DET is "0" and the present input signal Vin belongs to the second range W2, for example, the present output signal DET is set to "0". By contrast, in the case where the previous output signal DET is "1" and the present input signal Vin belongs to the second range W2, the present output signal DET is set to "1". In the case where the input signal Vin belongs to the second range W2 or the fourth range W4, the output signal DET is "0" or "1" as shown in FIG. 2. The value of the output signal depends on the previous input signal Vin. In the case where the input signal Vin is changed from the third range W3 to the second range W2, the output signal DET is set to "0", and, in the case where the input signal Vin is changed from the first range W1 to the second range W2, the output signal DET is set to "1". In the case where the input signal Vin is changed from the third range W3 to the fourth range W4, the output signal DET is set to "0", and, in the case where the input signal Vin changed from the fifth range W5 to the fourth range W4, the output signal DET is set to "1".

In this embodiment, in order to specify to which range the input signal Vin belongs, it is determined whether the input signal Vin exceeds or fall below the first to fourth thresholds (−Va, −Vb, +Va, +Vb) or not. Specifically, the input signal adjusting section 300 is controlled so as to add the offset voltages Voff1 to Voff4 corresponding to the first to fourth thresholds.

The value of the previous output signal DET is indicated by DET'. FIG. 3 shows relationships between the first signal 10a which shows result of the comparison between the input signal Vin and the first to fourth thresholds (−Va, −Vb, +Va, +Vb), and the first to fifth ranges W1 to W5, and those of the present output signal DET and the ranges.

In the case where the first signal 10a corresponding to the first threshold −Va is "0", the first signal 10a corresponding to the second threshold −Vb is "0", the first signal 10a corresponding to the third threshold +Va is "0", and the first signal 10a corresponding to the fourth threshold +Vb is "1", for example, the input signal Vin is in the fourth range W4. In this case, as shown in FIG. 2, the present output signal DET is "0" or "1" in accordance with the state of the past input signal Vin. When the previous output signal DET' is "0", the present output signal DET is "0", and, when the previous output signal DET' is "1", the present output signal DET is "1". The determining section 200 executes a logical operation according to the truth table shown in FIG. 3 to produce the present output signal DET.

According to the hysteresis device 1000, hysteresis characteristics can be applied to the output signal DET which, when the absolute value of the input signal Vin is small, is "0", and, when the absolute value of the input signal Vin is large, is "1".

According to the hysteresis device 1000, moreover, the determination of the level of the input signal Vin in accordance with hysteresis characteristics that change at the plurality of thresholds is not performed by one measurement, but is performed in the following manner. The range to which the input signal Vin belongs is specified by a plurality of determinations by using the comparator 10 which determines the level relationship between the first output voltage V1 and the second output voltage V2. The present output signal DET to which hysteresis characteristics are provided is obtained based on the determination result and the previous output signal DET'. As a result, a plurality of Schmitt trigger circuits are not required, and addition and subtraction of minute voltages at a low operation voltage are unnecessary. Therefore, the operation of the hysteresis device 1000 can be stabilized.

1-2: Second Embodiment

FIG. 4 is a block diagram showing of a hysteresis device according to the second embodiment of the invention. Similarly with the above-described hysteresis device 1000, the hysteresis device 2000 produces the output signal DET to which the hysteresis characteristics shown in FIG. 2 is applied with respect the input signal Vin.

The hysteresis device 2000 includes a threshold selecting section 400. The threshold selecting section 400 selects one of the first to fourth thresholds (−Va, −Vb, +Va, +Vb) in accordance with the control signal CTL supplied from a determining section 201, and supplies the threshold to the comparator 10.

The determining section 201 executes the logical operation according to the truth table shown in FIG. 3 to produce the output signal DET, while, in the case where the first threshold −Va or the second threshold −Vb is designated, the first signal 10a is inverted, and, when the third threshold +Va or the fourth threshold +Vb is designated, the first signal 10a is used as it is. In the case where the control signal CTL designates the first threshold −Va, when the input signal Vin is smaller than the first threshold −Va, therefore, the first signal 10a is "0", and the determining section 201 inverts the signal and executes the logical operation while assuming that the first signal 10a is "1".

Similarly with the hysteresis device 1000, therefore, the hysteresis device 2000 can provide the output signal DET which, when the absolute value of the input signal Vin is small, is "0", and, when the absolute value of the input signal Vin is large, is "1", with hysteresis characteristics.

Moreover, in the determination of the level of the input signal Vin, the existence or non-existence of the signal is not performed by one measurement, but, while the plurality of thresholds are sequentially switched, the range to which the input signal Vin belongs is specified. Therefore, a plurality of Schmitt trigger circuits are not required, and addition and subtraction of minute voltages at a low operation voltage are unnecessary, with the result that the operation of the hysteresis device 2000 can be stabilized.

1-3: Modification

In the above-described first and second embodiments, in order to specify one of the ranges which are divided by the changing points of hysteresis characteristics, the input signal Vin belonging to the range, the control is performed so that the first to fourth thresholds are sequentially selected. Namely, the switching is performed four times. In the truth table shown in FIG. 3, the logical value of the present output signal DET is determined depending on the portions surrounded by the thick frames, and the other portions do not affect the present output signal DET. In view of this, when the truth table of in FIG. 3 is rewritten, the truth table shown in FIG. 5 is obtained. In FIG. 5, the columns indicated by "-" mean that the value may be any of "0" or "1".

That is, only in the second range W2 and the fourth range W4, the logical value of the present output signal DET is affected by the previous output signal DET', and, in the first range W1, the third range W3, and the fifth range W5, it is not necessary to refer the previous output signal DET'. When the input signal Vin is smaller than the first threshold −Va, the first range W1 is ascertained. In this case, the present output signal DET is "1". Therefore, switchings to the second to fourth thresholds (−Vb, +Va, +Vb) are not required.

Figure 6:
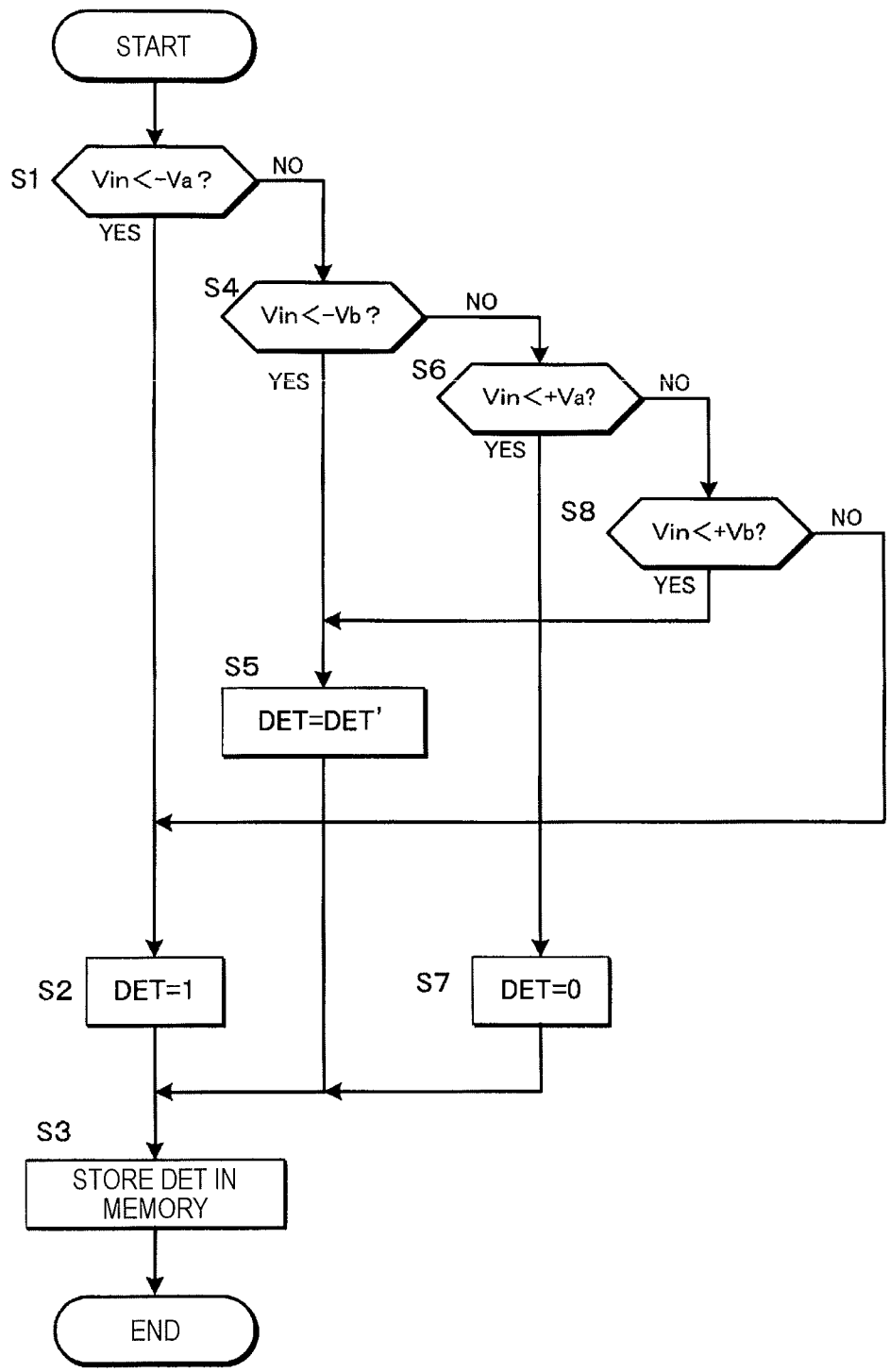
FIG. 6 is a flowchart showing the operation of the determining section in the third embodiment.

Therefore, the determining sections 200 and 201 may perform the determining operation in accordance with the flowchart shown in FIG. 6.

First, the determining sections 200 and 201 determine whether the input signal Vin is smaller than the first threshold −Va or not (step S1). Specifically, the control signal CTL designating the first threshold −Va is produced. At this time, when the first signal 10a is "1", it is determined that the input signal Vin is smaller than the first threshold −Va. This means the case where the input signal Vin belongs to the first range W1 shown in FIG. 2, and the present output signal DET is set to "1" (step S2). The determining sections 200 and 201 store the present output signal DET of "1" in the memory (step S3), and ends the process.

By contrast, when the first signal 10a is "0" in the determination process of step S1, the determination conditions are denied, and it is determined whether the input signal Vin is smaller than the second threshold −Vb or not (step S4). Specifically, the control signal CTL designating the second threshold −Vb is produced. At this time, when the first signal 10a is "1", it is determined that the input signal Vin is smaller than the second threshold −Vb, and the process advances to step S5. This means the case where the input signal Vin belongs to the second range W2 shown in FIG. 2. In step S5, the determining sections 200 and 201 read the previous output signal DET' from the memory, and set the logical value of the signal as that of the present output signal DET. When the previous output signal DET' is "1", therefore, the present output signal DET is "1", and, when the previous output signal DET' is "0", the present output signal DET is "0".

Next, when the first signal 10a is "0" in the determination process of step S4, the determination conditions are denied, and it is determined whether the input signal Vin is smaller than the third threshold +Va or not (step S6). Specifically, the control signal CTL designating the third threshold +Va is produced. At this time, when the first signal 10a is "1", it is determined that the input signal Vin is smaller than the third threshold +Va, and the process advances to step S7. This means the case where the input signal Vin belongs to the third range W3 shown in FIG. 2. The determining sections 200 and 201 set the present output signal DET to "0".

Next, when the first signal 10a is "0" in the determination process of step S6, the determination conditions are denied, and it is determined whether the input signal Vin is smaller than the fourth threshold +Vb or not (step S8). Specifically, the control signal CTL designating the fourth threshold +Vb is produced. At this time, when the first signal 10a is "1", it is determined that the input signal Vin is smaller than the fourth threshold +Vb, and the process advances to step S5. This means the case where the input signal Vin belongs to the fourth range W4 shown in FIG. 2. In step S5, the determining sections 200 and 201 read the previous output signal DET' from the memory, and set the logical value of the signal as that of the present output signal DET.

Next, when the first signal 10a is "0" in the determination process of step S8, the determination conditions are denied. In this case, the input signal Vin is equal to or larger than the fourth threshold +Vb, and belongs to the fifth range W5 shown in FIG. 2. The determining sections 200 and 201 set the present output signal DET to "1" (step S2).

When the process of step S5 or S7 are ended, the determining sections 200 and 201 write the present output signal DET in the memory. When step S5 is ended, the previous output signal DET' and the present output signal DET coincide with each other, and therefore the writing in the memory may be omitted.

According to the modification, when divided by the first to fourth thresholds, the level of the input signal Vin is divided into the first to fifth ranges W1 to W5. Among the first to fifth ranges W1 to W5, the range where the output signal DET is "0" is set as a first logical value range, that where the output signal DET is "1" is set as a second logical value range, and that where the output signal DET is "0" or "1" is set as a common range, the third range W3 shown in FIG. 3 is the first logical value range, the first range W1 and the fifth range W5 are the second logical value range, and the second range W2 and the fourth range W4 are the common range.

The determining sections 200 and 201 determine to which one of the first logical value range, the second logical value range, and the common range the input signal Vin belongs, based on the first signal 10a corresponding to the first to fourth thresholds (steps S1, S4, S6, and S8). If the input signal Vin belongs to the first logical value range (the third range W3), the present output signal DET is set to "0" (step S7). If the input signal Vin belongs to the second logical value range (the first range W1 or the fifth range W5), the present output signal DET is set to "1" (step S2). If the input signal Vin belongs to the common range, the present output signal DET is made coincident with the previous output signal DET' (step S5).

Based on the first signal 10a corresponding to the plurality of thresholds, the determining sections 200 and 201 determine to which one of the first logical value range, the second logical value range, and the common range the input signal belongs. However, it is not always necessary to obtain the first signal 10a for all the thresholds. When it is possible to determine that the input signal belongs to one of the three ranges, the switching of the threshold can be stopped at this timing. Therefore, the processing speed of the hysteresis device can be improved, and moreover the power consumption can be lowered in accordance with the reduction of the number of the switching operations.

2. Magnetic Detecting Apparatus

Next, a magnetic detecting apparatus to which the above-described hysteresis device 1000 or 2000 is applied will be described.

2-1: Fourth Embodiment

Figure 7:
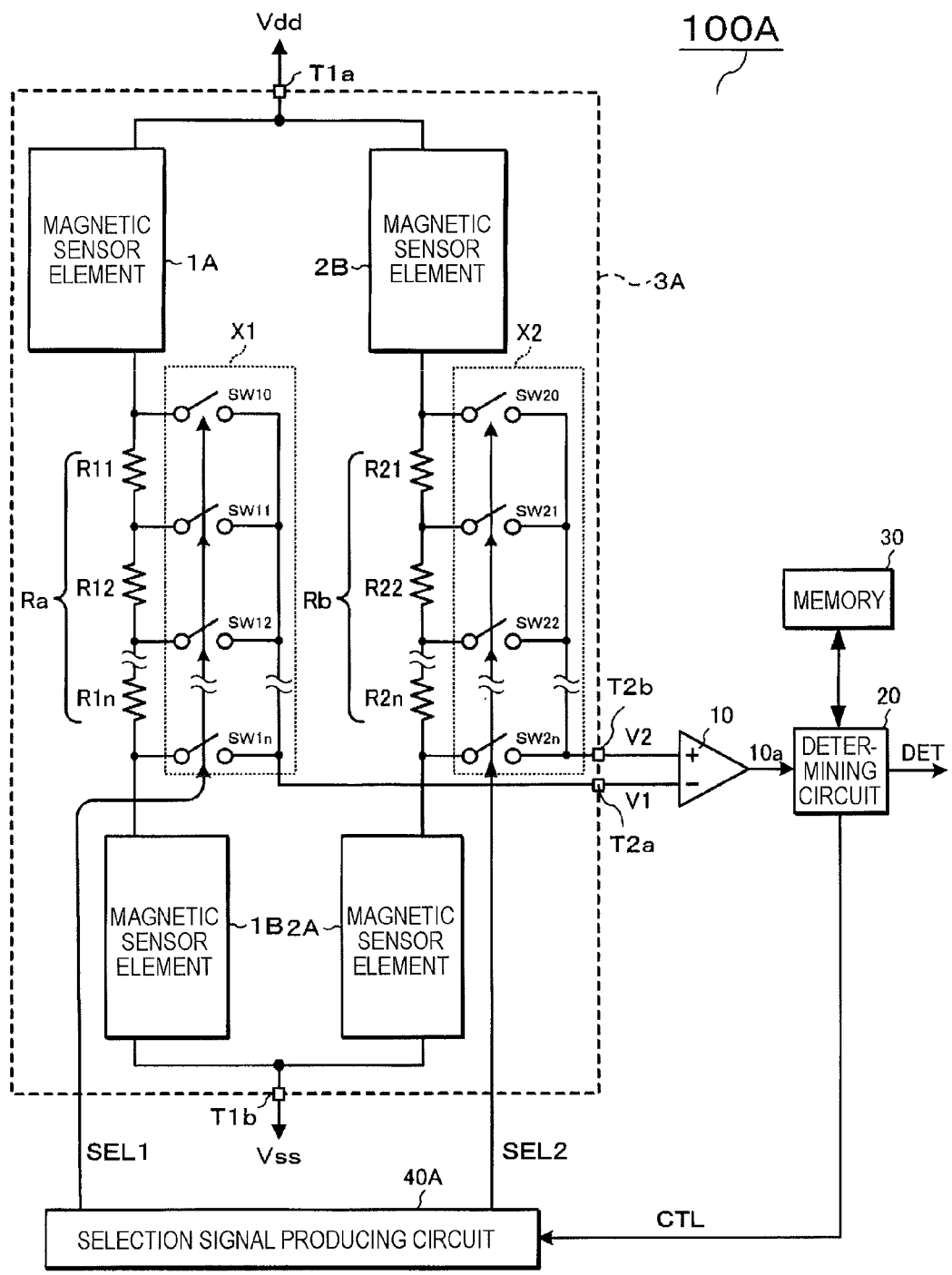
FIG. 7 is a block diagram showing the configuration of a magnetic detecting apparatus according to a fourth embodiment.

The Embodiment of the invention will be described with reference to the drawings. FIG. 7 is a block diagram showing the configuration of a magnetic detecting apparatus 100A according to the fourth embodiment of the invention. As shown in the figure, the magnetic detecting apparatus 100A is configured by using the above-described hysteresis device 1000, and includes a bridge circuit 3A, the comparator 10, a determining circuit 20, a memory 30, and a selection signal producing circuit 40A.

In this embodiment, the input signal Vin is the field strength of the external magnetic field. The bridge circuit 3A and the selection signal producing circuit 40A correspond to the input signal adjusting section 300, and the determining circuit 20 and the memory 30 correspond to the determining section 200.

The bridge circuit 3A includes a first power supply terminal T1a to which a high power supply potential Vdd is supplied, a second power supply terminal T1b to which a low power supply potential Vss is supplied, a first output terminal T2a through which the first output voltage V1 is taken out, and a second output terminal T2b through which the second output voltage V2 is taken out.

In a first path from the first power supply terminal T1a to the second power supply terminal T1b, a first magnetic sensor element 1A, a first ladder resistor Ra, and a second magnetic sensor element 1B are connected in series. In a second path from the first power supply terminal T1a to the second power supply terminal T1b, a third magnetic sensor element 2B, a second ladder resistor Rb, and a fourth magnetic sensor element 2A are connected in series.

Each of the first to fourth magnetic sensor elements 1A, 1B, 2B, 2A is configured by a magnetoresistance element. As the element, for example, a GMR element can be employed. In the first and fourth magnetic sensor elements 1A and 2A, when the external magnetic field (+H) in the positive direction (+) is increased in intensity, the resistance is increased, and, when the external magnetic field (−H) in the negative direction (−) is increased in intensity, the resistance is reduced. By contrast, in the second and third magnetic sensor elements 1B and 2B, when the external magnetic field (−H) in the negative direction (−) is increased in intensity, the resistance is increased, and, the external magnetic field (+H) in the positive direction (+) is increased in intensity, the resistance is reduced.

Figure 8:
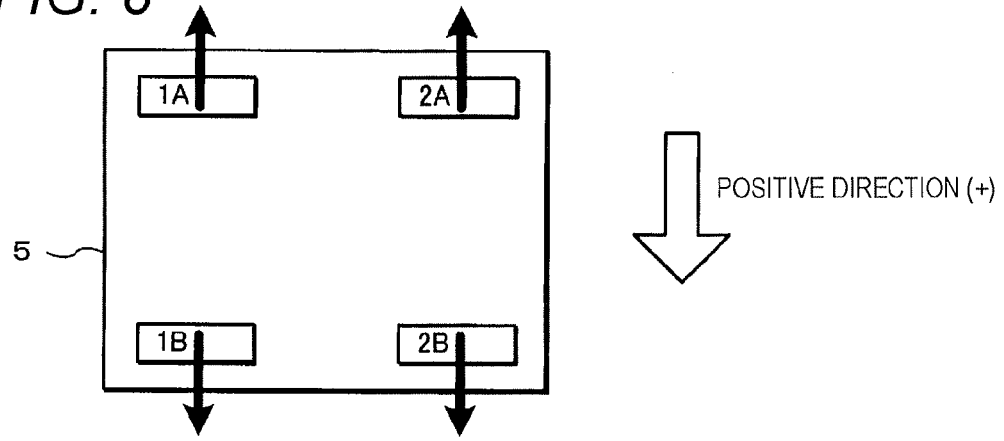
FIG. 8 is a diagram showing the arrangement of first to fourth magnetic sensors on a substrate.

FIG. 8 is a diagram showing the arrangement of the first to fourth magnetic sensor elements 1A, 1B, 2B, 2A on a substrate. The substrate 5 is configured by: a silicon substrate on which circuits such as transistors are formed; a wiring layer on the silicon substrate; and a thick film layer of a silicon oxide film ($SiO_2$) formed on the wiring layer.

In the case where the first to fourth magnetic sensor elements 1A, 1B, 2B, 2A are configured by magnetoresistance elements such as GMR elements, the magnetoresistance elements can be formed in the thick film layer on the silicon substrate. In the case where GMR elements are employed, when a plurality of strip-like elements configured by a free layer, a spacer layer, a pin layer, and a gap layer are connected in series by lead wires, it is possible to form one magnetic sensor element.

When four such magnetoresistance elements are arranged so that the longitudinal directions of the elements are parallel to opposed sides of the substrate, and then subjected to the ordering heat treatment, the magnetization directions of the pin layers can be fixed to a direction which is parallel to the surface of the substrate, and which is perpendicular to the longitudinal directions of the magnetoresistance elements. In FIG. 8, the magnetization directions of the pin layers are indicated by the black arrows.

Returning to FIG. 7, the first ladder resistor Ra is configured by connecting in series an n (n is a natural number which is equal to or larger than 2) number of resistor elements R11, R12, ..., R1n. The end nodes of the resistor elements R11, R12, ..., R1n are connected to one terminals of switches SW10 to SW1n, respectively. The other terminals of the switches SW10 to SW1n are connected to the first output terminal T2a. The switches SW10 to SW1n function as a first selecting portion X1 which selects one of the plurality of nodes of the first ladder resistor Ra, and which connects the selected node to the first output terminal T2a.

Similarly, the second ladder resistor Rb is configured by connecting in series an n number of resistor elements R21, R22, ..., R2n. The end nodes of the resistor elements R21, R22, ..., R2n are connected to one terminals of switches SW20 to SW2n, respectively. The other terminals of the switches SW20 to SW2n are connected to the second output terminal T2b. The switches SW20 to SW2n function as a second selecting portion X2 which selects one of the plurality of nodes of the second ladder resistor Rb, and which connects the selected node to the second output terminal T2b.

In this embodiment, the selection signal producing circuit 40A supplies a selection signal SEL1 which turns on one of the switches SW10 to SW1n, and which turns off the other switch/switches, and a selection signal SEL2 which turns on one of the switches SW20 to SW2n, and which turns off the other switch/switches.

Here, a case where the selection signals SEL1 and SEL2 designate selections of the midpoints of the first ladder resistor Ra and the second ladder resistor Rb, respectively is assumed. In this case, when the field strength of the external magnetic field is zero, the first output voltage V1 and the second output voltage V2 are equal to each other. When the external magnetic field (+H) in the positive direction (+) is increased in intensity, the resistances of the magnetic sensor elements 1A and 2A are increased, those of the magnetic sensor elements 1B and 2B are reduced, and therefore V2>V1. Conversely, when the external magnetic field (−H) in the negative direction (−) is increased in intensity, the resistances of the magnetic sensor elements 1B and 2B are increased, those of the magnetic sensor elements 1A and 2A are reduced, and therefore V2<V1.

Next, the comparator 10 compares the first output voltage V1 output from the first output terminal T2a with the second output voltage V2 output from the second output terminal T2b, and produces the first signal 10a.

The determining circuit 20 outputs the output signal DET indicative of the existence or non-existence of magnetism, and supplies the control signal CTL to the selection signal producing circuit 40A so as to select the nodes in the first selecting portion X1 and the second selecting portion X2 in a predetermined sequence. The output signal DET of "1" indicates the existence of magnetism, and the signal of "0" indicates the non-existence of magnetism. The determining circuit 20 stores the produced output signal DET in the memory 30, and, in the next determination, uses the previous output signal DET.

In the determination of the existence or non-existence of magnetism, in the case where the field strength of the external magnetic field (+H) in the positive direction (+H) is higher than an upper limit threshold, or that of the external magnetic field (−H) in the negative direction (−) is lower than a lower limit threshold, it is determined that there is magnetism, and, in the case where the field strength is between the upper limit threshold and the lower limit threshold, it is determined that there is no magnetism. When the field strength is varied in the vicinity of the lower limit threshold or the upper limit threshold, however, chattering occurs. Therefore, it is necessary to provide hysteresis characteristics.

In this embodiment, the input signal Vin is the field strength of the external magnetic field, hysteresis characteristics are those shown in FIG. 2, and the first to fourth thresholds are −H1, −H2, +H1, and +H2, respectively. As shown in the figure, from the state where there is no magnetism or "0", the external magnetic field (−H) in the negative direction (−) is gradually increased, and, when the field strength is smaller than the first threshold −H1, the state is changed to that where there is magnetism or "1". By contrast, in the case where, from the state where the external magnetic field (−H) in the negative direction (−) is high or that where there is magnetism or "1", the field strength of the external magnetic field (−H) gradually approaches zero, when the field strength is larger than the second threshold −H2, the state is changed to that where there is no magnetism or "0". When the external magnetic field (+H) in the positive direction (+) is gradually increased and the field strength is larger than the fourth threshold +H2, the state is changed to that where there is magnetism or the state of "1". By contrast, in the case where, from the state where the external magnetic field (+H) in the positive direction (+) is high or that where there is magnetism or "1", the field strength of the external magnetic field (+H) gradually approaches zero, when the field strength is smaller than the third threshold +H1, the state is changed to that where there is no magnetism or "0".

Here, the range where the field strength is smaller than the first threshold −H1 is indicated as the first range W1, that where the field strength is not smaller than the first threshold −H1 and smaller than the second threshold −H2 is indicated as the second range W2, that where the field strength is not smaller than the second threshold −H2 and smaller than the third threshold +H1 is indicated as the third range W3, that where the field strength is not smaller than the third threshold +H1 and smaller than the fourth threshold +H2 is indicated as the fourth range W4, and that where the field strength is not smaller than the fourth threshold +H2 is indicated as the fifth range W5. The determining circuit 20 determines to which one of the ranges the present field strength belongs, and produces the present output signal DET which is provided with hysteresis characteristics, based on the determination result and the previous output signal DET.

In this embodiment, in order to specify to which range the field strength of the external magnetic field belongs, it is determined whether the field strength exceeds or falls below the first to fourth thresholds (−H1, −H2, +H1, +H2). Specifically, when an external magnetic field corresponding to the first to fourth threshold is applied, the selections of nodes by the first selecting portion X1 and the second selecting portion X2 are switched.

In the case where the node of the first ladder resistor Ra which is close to the magnetic sensor element 1A is selected by the first selecting portion X1, the first output voltage V1 is made higher, and, in the case where the node of the first ladder resistor Ra which is close to the magnetic sensor element 1B is selected, the first output voltage V1 is made lower. This is similar in the selection of a node by the second selecting portion X2. Namely, the levels of the first output voltage V1 and the second output voltage V2 can be adjusted by selecting which one of the nodes. As described above, when the external magnetic field (+H) in the positive direction (+) is increased in intensity, the first output voltage V1 is raised and the second output voltage V2 is lowered, and, when the external magnetic field (−H) in the negative direction (−) is increased in intensity, the second output voltage V2 is raised, and the first output voltage V1 is lowered. In the case where nodes are adequately selected by the first selecting portion X1 and the second selecting portion X2, when an external magnetic field corresponding to the first to fourth thresholds is applied, the first output voltage V1 can be made equal to the second output voltage V2.

More specifically, the determining circuit 20 supplies the control signal CTL which sequentially designates the kinds of the first to fourth thresholds, to the selection signal producing circuit 40A. For example, the control signal CTL is a two-bit signal, designates the selection corresponding to the first threshold −H1 in the case of "00", designates that corresponding to the second threshold −H2 in the case of "01", designates that corresponding to the third threshold +H1 in the case of "10", and designates that corresponding to the forth threshold +H2 in the case of "11". When the control signal CTL is switched in the sequence of "00"→"01"→"10"→"11", results of comparisons in which the field strength of the external magnetic field is compared with each of the first to fourth thresholds can be obtained as the first signal 10a of the comparator 10.

When the field strength of the external magnetic field is indicated by Hx and the value of the previous output signal DET is indicated by DET', relationships between the first signal 10a which shows the results of the comparisons with the first to fourth thresholds (−H1, −H2, +H1, +H2), and the first to fifth ranges W1 to W5, and those of the present output signal DET and the ranges can be expressed by, in FIGS. 3 and 5 above, replacing Vin with Hx, −Va with −H1, −Vb with −H2, +Va with +H1, and +Vb with +H2. This is applicable also to FIG. 6.

Namely, the determining circuit 20 executes a logical operation according to the truth table shown in FIG. 3 to produce the present output signal DET.

According to the fourth embodiment, in determination of the field strength of the external magnetic field in accordance with hysteresis characteristics that change at the plurality of thresholds, as described above, detection of the existence or non-existence of magnetism is not performed by one measurement, but the nodes of the first ladder resistor Ra and second ladder resistor Rb which function as a balance resistor are allowed to be selected, and therefore the configuration of the subsequent stage can be significantly simplified. The range to which the field strength of the external magnetic field belongs is determined by a plurality of determinations by using the comparator 10 which determines the level relationship between the first output voltage V1 and the second output voltage V2. The present output signal DET to which hysteresis characteristics are provided can be obtained based on the determination result and the previous output signal DET'. As a result, a plurality of Schmitt trigger circuits are not required, and addition and subtraction of minute voltages at a low operation voltage are unnecessary. Therefore, the operation of the magnetic detecting apparatus 100A can be stabilized.

The determining circuit 20 executes the determining operation in accordance with the flowchart shown in FIG. 6, so that the processing speed can be improved, and the power consumption can be lowered.

2-2: Fifth Embodiment

Figure 9:
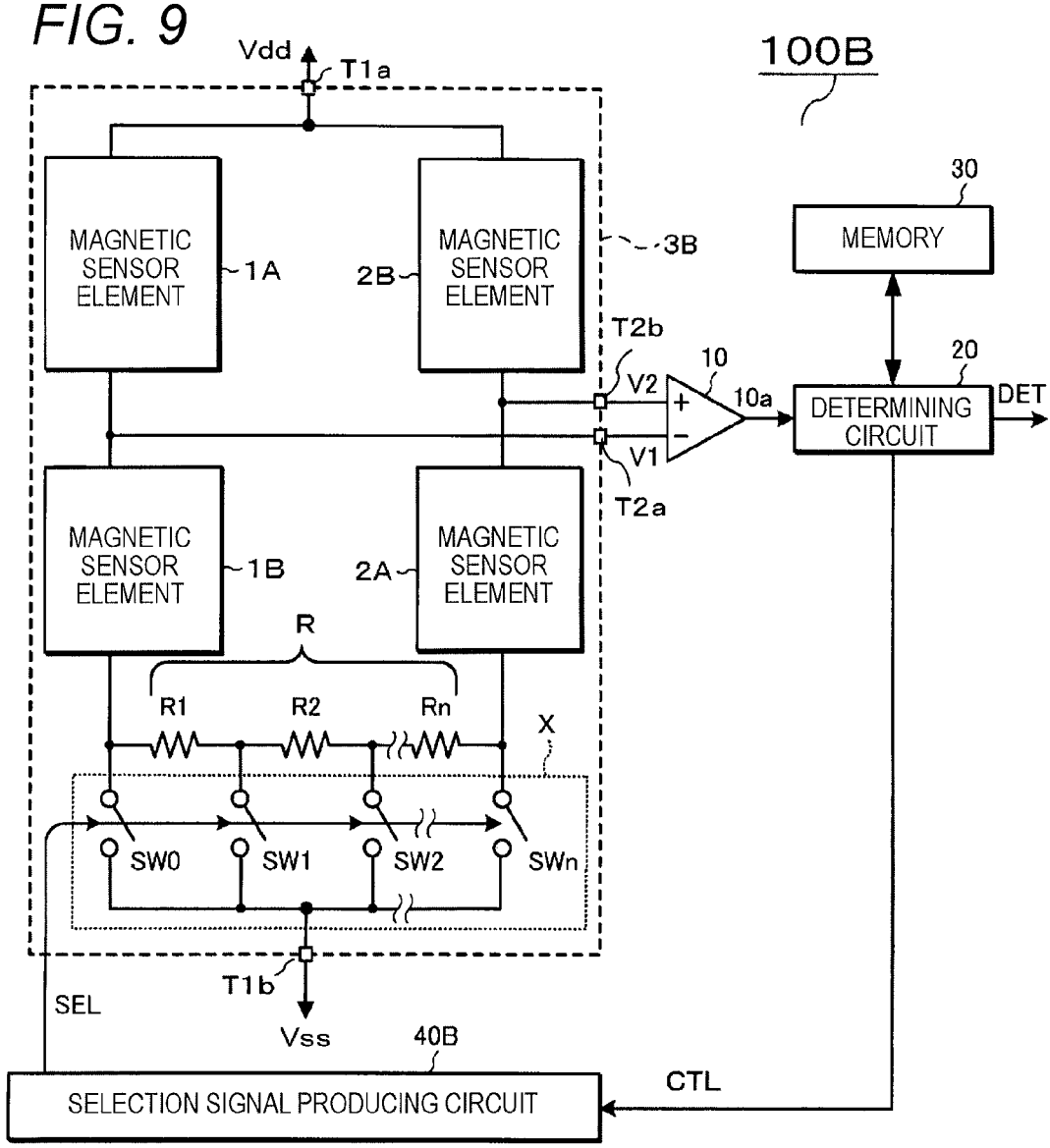
FIG. 9 is a block diagram showing the configuration of a magnetic detecting apparatus according to a fifth embodiment.

Next, a magnetic detecting apparatus 100B according to the fifth embodiment will be described. FIG. 9 is a block diagram showing the configuration of the magnetic detecting apparatus 100B according to the fifth embodiment. The magnetic detecting apparatus 100B is configured in the same manner as the magnetic detecting apparatus 100A shown in FIG. 7, except that a bridge circuit 3B is used in place of the bridge circuit 3A, and a selection signal producing circuit 40B is used in place of the selection signal producing circuit 40A. The components identical with those of FIG. 7 are denoted by the same reference numerals, and their description is adequately omitted.

In the bridge circuit 3B, one terminal of the magnetic sensor element 1A is connected to the first power supply terminal T1a, and the other terminal is connected to the first output terminal T2a. One terminal of the second magnetic sensor element 1B is connected to one terminal of the ladder resistor R, and the other terminal is connected to the first output terminal T2a. One terminal of the third magnetic sensor element 2B is connected to the first power supply terminal T1a, and the other terminal is connected to the second output terminal T1b. One terminal of the magnetic sensor element 2A is connected to the other terminal of the ladder resistor R, and the other terminal is connected to the second output terminal T2b.

A selecting portion X is configured by an n (n is a natural number which is equal to or larger than 2) number of switches SW0 to SWn, and a ladder resistor R is configured by connecting in series an n number of resistor elements R1, R2, . . . , Rn. The end nodes of the resistor elements R1, R2, . . . , Rn are connected to one terminals of the switches SW0 to SWn, respectively. The other terminals of the switches SW0 to SWn are connected to the second output terminal T1b. The selecting portion X selects one of a plurality of nodes of the ladder resistor R, and connects the selected node to the second output terminal T1b.

The selection signal producing circuit 40B produces a selection signal SEL based on the control signal CTL, and supplies it to the selecting portion X. The node selection in the selecting portion X can adjust the balance of a first path from the first power supply terminal T1a to the second power supply terminal T1b through the magnetic sensor elements 1A and 1B, and a second path from the first power supply terminal T1a to the second power supply terminal T1b through the magnetic sensor elements 2A and 2B.

Specifically, in a similar manner as the fourth embodiment, the node selection in the selecting portion X is switched so that, when an external magnetic field corresponding to the first to fourth thresholds is applied, the first output voltage V1 is equal to the second output voltage V2.

According to the magnetic detecting apparatus 100B, similarly with the fourth embodiment, in determination of the field strength of the external magnetic field in accordance with hysteresis characteristics that change at the plurality of thresholds, detection of the existence or non-existence of magnetism is not performed by one measurement, but the nodes of the ladder resistor R which functions as a balance resistor are allowed to be selected, and therefore the configuration of the subsequent stage can be significantly simplified. Therefore, a plurality of Schmitt trigger circuits are not required, and addition and subtraction of minute voltages at a low operation voltage are unnecessary. Therefore, the operation of the magnetic detecting apparatus 100B can be stabilized.

As compared with the magnetic detecting apparatus 100A of the fourth embodiment, the ladder resistor and the selecting portion can be reduced in number, and therefore the configuration can be further simplified.

2-3: Sixth Embodiment

Figure 10:
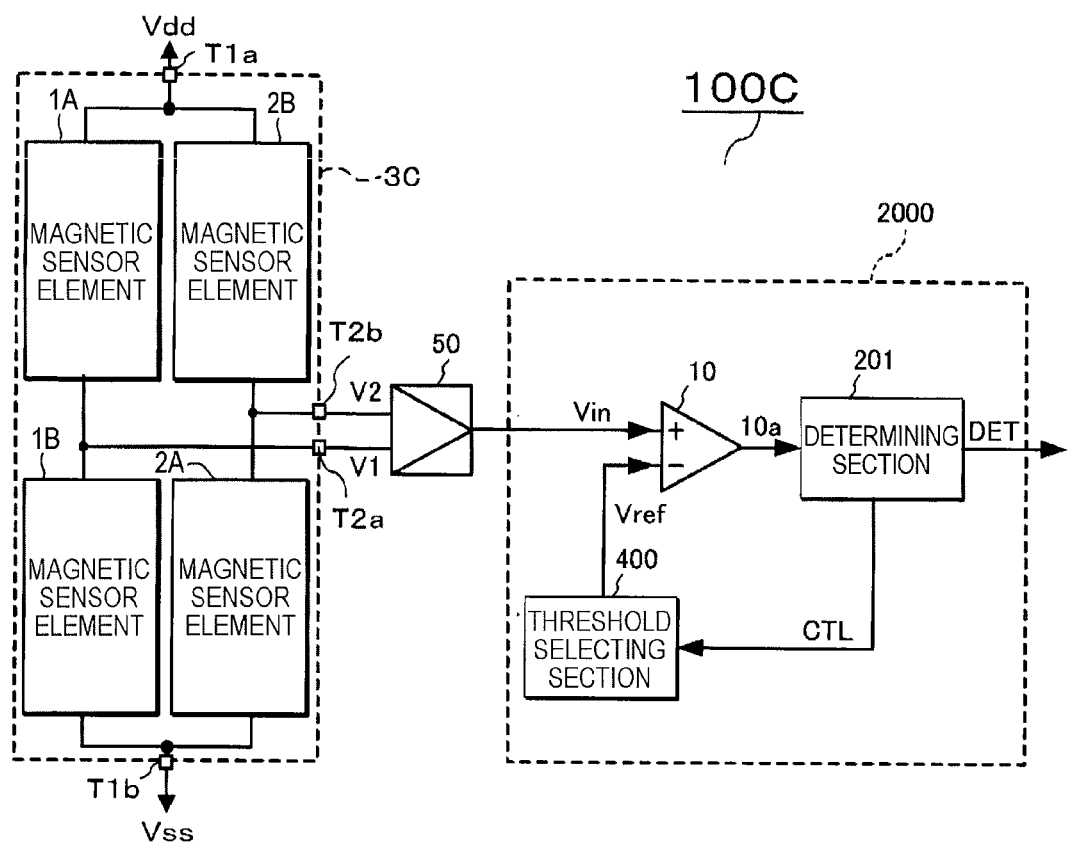
FIG. 10 is a block diagram showing the configuration of a magnetic detecting apparatus according to a sixth embodiment.

Next, a magnetic detecting apparatus 100C according to the sixth embodiment will be described. FIG. 10 is a block diagram showing the configuration of the magnetic detecting apparatus 100C according to the sixth embodiment. The magnetic detecting apparatus 100C includes a bridge circuit 3C, a differential amplifier 50, and the hysteresis device 2000. The components identical with those of FIGS. 4 and 9 are denoted by the same reference numerals, and their description is adequately omitted.

The bridge circuit 3C has a configuration in which the ladder resistor R and the selecting portion X are omitted from the bridge circuit 3B shown in FIG. 9. The first output voltage V1 which is output from the bridge circuit 3C is supplied to the negative input terminal of the differential amplifier 50, and the second output voltage V2 is supplied to the positive input terminal of the amplifier. The differential amplifier 50 amplifies the outputs of the bridge circuit 3C to produce the input signal Vin. The hysteresis device 2000 produces the output signal DET to which the hysteresis characteristics shown in FIG. 2 are provided.

According to the magnetic detecting apparatus 100C, in determination of the field strength of the external magnetic field in accordance with hysteresis characteristics that change at the plurality of thresholds, detection of the existence or non-existence of magnetism is not performed by one measurement, but the present output signal DET is produced based on the first signal 10a which is obtained by switching a plurality of thresholds, and the previous output signal DET. As a result, a plurality of Schmitt trigger circuits are not required, and addition and subtraction of minute voltages at a low operation voltage are unnecessary. Therefore, the operation of the magnetic detecting apparatus 100C can be stabilized.

2-4: Modifications

The invention is not limited to the above-described embodiments, and for example the following modifications are possible.

(1) In the fourth embodiment, a ladder resistor is disposed in each of the first path including the magnetic sensor elements 1A and 1B, and the second path including the magnetic sensor elements 2A and 2B. In the fifth embodiment, the ladder resistor is disposed so as to straddle between the first and second paths. Alternatively, a ladder resistor may be disposed only in one of the paths, and a plurality of nodes may be selected. Namely, it is required to dispose a ladder resistor in at least one of the first and second paths.

In the fifth embodiment, the ladder resistor R may be disposed on the side of the first power supply terminal T1a.

The ladder resistor of the present invention may be formed by thin film resistors, each having a constant thickness. For example, the thin film resistors may be formed by a semiconductor element, such as a silicon or a polysilicon or may be formed by metal wires.

Also, GMR element may be used as the resistor. One of the magnetoresistance elements described in the above embodiments is formed by a plurality of strip shaped magneto-sensitive portions which are connected in series through conductive portions. In a case that the GMR element is used as the resistor, a switch may be provided on each of the conductive portions. The switch is not required to be formed in a part in which the magnetoresistance element is formed, and may be formed on a silicon substrate through an insulation layer formed by silicon oxide and so on. By such configuration, a resistance value of each of the GMR elements can be changed. Also, the first output voltage V1 and the second output voltage V2 can be equal to each other by selecting switches (nodes) when the external magnetic field is applied.

Also, by such configuration, a size of the circuit can be reduced compared with a similar circuit on which a polysilicon resistor is additionally provided.

(2) In the fourth and fifth embodiment, the node of the ladder resistor may be selected so as to cancel the offset voltage of the comparator 10. When the offset voltage which is converted to the input of the comparator 10 is $\Delta V$ (=V2−V1), the node may be selected so that V2−V1=−$\Delta V$ is attained. In the case where a node corresponding to the first threshold −H2 is to be selected, when the field strength Hx of the external magnetic field is the first threshold −H2, for example, the node may be selected so that V2−V1=−$\Delta V$ is attained.

According to the modification, the offset voltage of the comparator 10 can be cancelled, and therefore the existence or non-existence of magnetism can be detected more accurately.

Here, the details of the above embodiments are summarized as follows.

A hysteresis device produces an output signal in accordance with hysteresis characteristics that changes at a plurality of thresholds with respect to an input signal. The hysteresis apparatus includes:

an input signal adjusting section that outputs an adjustment signal in which an offset level corresponding to each of the plurality of thresholds is added to the input signal;

a comparator that outputs a first signal based on the adjustment signal, the first signal being binarized; and a determining section that controls the input signal adjusting section to switch the offset level for each of the plurality of thresholds, that acquires the first signal for each switching of the offset level, and that produces a present output signal based on a previous output signal and the first signals corresponding to the plurality of threshold.

According to the above configuration, determination of the level of the input signal in accordance with hysteresis characteristics that changes at the plurality of thresholds is not performed by one measurement, but is performed in a manner where, among a plurality of ranges which are divided by the thresholds, the range to which the input signal belongs is specified by a plurality of determinations, and the present output signal to which hysteresis characteristics are provided is obtained based on the determination result and the previous output signal. As a result, a plurality of Schmitt trigger circuits are not required, and addition and subtraction of minute voltages at a low operation voltage are unnecessary. Therefore, the operation of the hysteresis device can be stabilized.

In the above-described hysteresis device, preferably, the input signal adjusting section produces the adjustment signal in a differential form, and the comparator compares the adjustment signal in a differential form to produce the first signal.

Preferably, the determining section outputs a control signal which designates the offset level corresponding to the plurality of thresholds, and the input signal adjusting section includes: first and second output terminals that output the adjustment signal in a differential form; four sensor elements; and an adjusting portion which switches the offset level based on the control signal. For example, a bridge circuit 3A and selection signal producing circuit 40A which are shown in FIG. 7 correspond to the thus-configured input signal adjusting section, and the selection signal producing circuit 40A, a first ladder resistor Ra, a second ladder resistor Rb, a first selecting portion X1, and a second selecting portion X2 correspond to the adjusting portion.

Next, the other hysteresis device of the invention is a hysteresis device which produces an output signal in accordance with hysteresis characteristics that changes at a plurality of thresholds with respect to an input signal, wherein the apparatus includes: a threshold selecting section which selectively outputs the plurality of thresholds; a comparator which compares the input signal with the threshold that is selected by the threshold selecting section, and which outputs a first signal that is binarized; and a determining section which controls the threshold selecting section to switch the plurality of thresholds, which obtains the first signal for each switching of the plurality of thresholds, and which produces a present output signal based on a previous output signal and the first signals corresponding to the plurality of thresholds.

According to the above configuration, determination of the level of the input signal in accordance with hysteresis characteristics that change at the plurality of thresholds is not performed by one measurement, but is performed in a manner where, among a plurality of ranges which are divided by the thresholds, the range to which the input signal belongs is specified by a plurality of determinations, and the present output signal to which hysteresis characteristics are provided is obtained based on the determination result and the previous output signal. As a result, a plurality of Schmitt trigger circuits are not required, and addition and subtraction of minute voltages at a low operation voltage are unnecessary. Therefore, the operation of the hysteresis device can be stabilized.

In the above-described hysteresis device, preferably, when divided by the plurality of thresholds, the input signal is divided into a plurality of ranges; the output signal is binarized into a first logical value and a second logical value; among the plurality of ranges, a range where the output signal has the first logical value is set as a first logical value range, a range where the output signal has the second logical value is set as a second logical value range, and a range where the output signal has the first logical value or the second logical value is set as a common range; and the determining section determines, base on the first signal corresponding to the plurality of thresholds, to which one of the first logical value range, the second logical value range, and the common range the input signal belongs, sets, if the input signal belongs to the first logical value range, a present output signal as the first logical value, sets, if the input signal belongs to the second logical value range, the present output signal as the second logical value, and, if the input signal belongs to the common range, makes the present output signal coincident with a previous output signal.

According to the above configuration, based on the first signal corresponding to the plurality of thresholds, it is determined to which one of the first logical value range, the second logical value range, and the common range the input signal belongs. However, it is not always necessary to obtain the first signal for all the thresholds. When it is possible to determine that the input signal belongs to one of the three ranges, the switching of the threshold can be stopped at this timing. Therefore, the processing speed can be improved, and moreover the power consumption can be lowered in accordance with the reduction of the number of the switching operations.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2010-234553 filed on Oct. 19, 2010, the contents of which are incorporated herein by reference.

DESCRIPTION OF REFERENCE NUMERALS AND SIGNS 100A, 100B, 100C . . . magnetic detecting apparatus, 1A, 1B, 2A, 2B . . . magnetic sensor element, 10 . . . comparator, 20 . . . determining circuit, 30 . . . memory, 40A, 40B . . . selection signal producing circuit, 3A, 3B, 3C . . . bridge circuit, 200 . . . determining section, 300 . . . input signal adjusting section, 400 . . . threshold selecting section, 1000, 2000 . . . hysteresis device, CTL . . . control signal, DET . . . output signal.

What is claimed is:

1. A hysteresis device which produces an output signal in accordance with hysteresis characteristics that changes at a plurality of thresholds with respect to an input signal, the hysteresis device comprising:
   an input signal adjusting section that outputs an adjustment signal in which an offset level corresponding to each of the plurality of thresholds is added to the input signal;
   a comparator that outputs a first signal based on the adjustment signal, the first signal being binarized; and
   a determining section that controls the input signal adjusting section to switch the offset level for each of the plurality of thresholds, that acquires a respective first signal from the comparator for each switching of the offset level, and that produces a present output signal based on a previous output signal and the respective first signals corresponding to the plurality of thresholds,
   wherein the determining section includes a memory for storing the previous output signal of the determining section; and
   wherein the determining section produces the present output signal based on the previous output signal of the determining section stored in the memory and the first signals corresponding to the plurality of thresholds.

2. The hysteresis device according to claim 1,
   wherein the input signal adjusting section produces differential signals as the adjustment signal; and
   wherein the comparator compares the differential signals to produce each of the first signals.

3. The hysteresis device according to claim 2,
   wherein the determining section outputs a control signal which designates the offset level corresponding to one of the plurality of thresholds; and
   wherein the input signal adjusting section includes:
      first and second output terminals which output the differential signals;
      four sensor elements; and
      an adjusting portion which switches the offset levels corresponding to the plurality of thresholds based on the control signal.

4. The hysteresis device according to claim 1,
   wherein when divided by the plurality of thresholds, the input signal is divided into a plurality of ranges;
   wherein the output signal is binarized into a first logical value and a second logical value;
   wherein among the plurality of ranges, a range where the output signal has the first logical value is set as a first logical value range, a range where the output signal has the second logical value is set as a second logical value range, and a range where the output signal has the first logical value or the second logical value is set as a common range; and wherein the determining section determines, base on the first signals corresponding to the plurality of thresholds, that the input signal is belonged to which one of the first logical value range, the second logical value range, and the common range as follows:

if the input signal belongs to the first logical value range, a present output signal is set as the first logical value;

if the input signal belongs to the second logical value range, the present output signal is set as the second logical value; and if the input signal belongs to the common range, the present output signal is set to be coincident with a previous output signal.

* * * * *